US 6,300,221 B1

(12) United States Patent
Roberds et al.

(10) Patent No.: US 6,300,221 B1
(45) Date of Patent: Oct. 9, 2001

(54) METHOD OF FABRICATING NANOSCALE STRUCTURES

(75) Inventors: Brian E. Roberds, Santa Clara; Brian S. Doyle, Cupertino; Peng Cheng, Campbell, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/409,164

(22) Filed: Sep. 30, 1999

(51) Int. Cl.[7] ................................................. H01L 21/76

(52) U.S. Cl. ..................... 438/435; 428/429; 428/735; 428/911; 428/954

(58) Field of Search ........................ 438/427, 429, 438/430, 435, 700, 736, 757, 911, 954, 735, 737, 738

(56) References Cited

U.S. PATENT DOCUMENTS 6,110,790 * 8/2000 Chen ................................... 438/305

* cited by examiner

*Primary Examiner*—Wael Fahmy
*Assistant Examiner*—William M. Brewster
(74) *Attorney, Agent, or Firm*—Blakely, Sokoloff, Taylor & Zafman LLP

(57) ABSTRACT

A method includes forming a spacer mask having a defined edge over a portion of a substrate, and alternatively conformally depositing over a portion of a substrate including the spacer mask a predetermined member of at least a first material and a second material. In one aspect, the first material and the second material have a different etch rate for a predetermined etchant. The method also includes forming a free-standing spacer comprising the first material and the second material having a width equivalent to the thickness of one of a layer of the first material and the second material.

24 Claims, 4 Drawing Sheets

METHOD OF FABRICATING NANOSCALE STRUCTURES

BACKGROUND OF THE INVENTION

1. Field of the Invention

The invention relates to semiconductor devices and more particularly to reduced feature size devices and the fabrication of the same.

2. Description of Related Art

One goal of metal oxide semiconductor field effect transistor (MOSFET) scaling is to increase the density and speed of the integrated circuits in which such scaled-down devices are utilized. Devices are formed on a semiconductor substrate typically by depositing material and then patterning that material to remove specific portions on the wafer surface. Optical lithography has been used to pattern and generate device structures down to 0.2 micron ($\mu$m) geometry. As the minimum feature size continues to be scaled down to sub-0.10 $\mu$m, other techniques, such as electron-beam (E-beam) lithography, x-ray lithography, or extreme ultraviolet (EUV) lithography have been attempted. These latter lithography methods are generally expensive and have presented many technical barriers to widespread use.

As technologies shrink, it is increasingly difficult to obtain performance increases. Increasing device density typically means using devices with smaller channel lengths and widths. Increasing the speed of integrated circuits is generally accomplished by increasing the saturation drain current ($I_{Dsat}$). Increasing the MOSFET $I_{Dsat}$ allows faster charging and discharging of parasitic capacitances. $I_{Dsat}$ is increased typically by either a decrease in the channel length or a decrease in the gate oxide thickness.

One factor that has generally not proved possible to scale is the transistor mobility. The electron and hole mobilities are a measure of the ease of carrier motion in a semiconductor crystal. In the semiconductor bulk, the carrier mobilities are typically determined by the amount of lattice scattering and ionized impurity scattering taking place inside the material. Carrier transport in the MOSFET, however, primarily occurs in the surface inversion layer. In small feature size devices, the mobility due to the gate-induced electric field (i.e., transverse electric field) and drain-induced electric field (i.e., longitudinal electric field) act on the carriers and significantly influence the velocity of the moving carriers in the inversion layer of a device channel. The drain-induced electric field acts to accelerate the carriers parallel to the semiconductor-gate oxide (e.g., Si-SiO$_2$) interface, whereupon the carrier suffers scattering similar to as in the bulk. The gate-induced electric field, however, also causes the carriers to be accelerated toward the semiconductor-gate oxide (e.g., Si-SiO$_2$) surface. Thus, the carriers near the surface experience additional motion-impeding collisions with the semiconductor surface. As a result, the carrier mobility at the surface is observed to be lower than in the bulk. These and other scattering mechanisms cause the mobility to saturate at what is referred to as velocity saturation. Velocity saturation prevents increases in mobility expected from decreases in gate length.

What is needed is a method of improving mobility in transistor devices.

SUMMARY OF THE INVENTION

A method is disclosed. The method includes forming a spacer mask having a defined edge over a first portion of a substrate, and alternatively conformally depositing over a second portion of a substrate including the spacer mask a predetermined number of layers of at least a first material and a second material. In one aspect, the first material and the second material have a different etch rate for a predetermined etchant. The method also includes forming a free-standing spacer comprising the first material and the second material, having a width equivalent to the thickness of one of a layer of the first material and a layer of the second material.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION OF THE INVENTION

Embodiments in accordance with the invention include a method of forming spacers, including reduced feature sized spacers, and a method of forming a transistor. The method includes forming a spacer mask having a defined edge, such as a vertical edge, over a portion of the substrate and alternatively conformally depositing over a portion of the substrate including the spacer mask a predetermined number of layers of at least a first material and a second material. In one example, the conformal deposition produces material components with at least two spatial components, e.g., a vertical component and a horizontal component, relative to the surface of the substrate. A portion of the vertical component is anisotropically etched to the substrate with a predetermined etchant that etches the first material and the second material at different etch rates. The etching step leaves a remaining portion of the first material and second material available as spacers having a width defined by the thickness of the conformally deposited material layers. The spacers may be used, for example, as an etch mask to form trenches in a portion of the substrate adjacent to the etch mask. In one sense, the trenches formed in the substrate may be utilized as horizontal "wires" for channel media of a transistor structure.

The spacers formed according to the methods of the invention have a width determined, in part, by the deposition thickness of the material layers formed on the substrate. In this regard, the methods are scalable and may be implemented, for example, in a multitude of device feature sizes.

Figure 11:
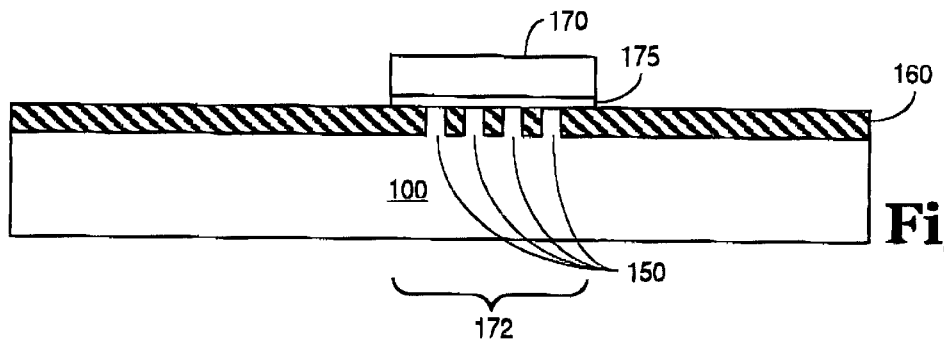
FIG. 11 shows a side view of the substrate depicted in FIG. 10.
Figure 12:
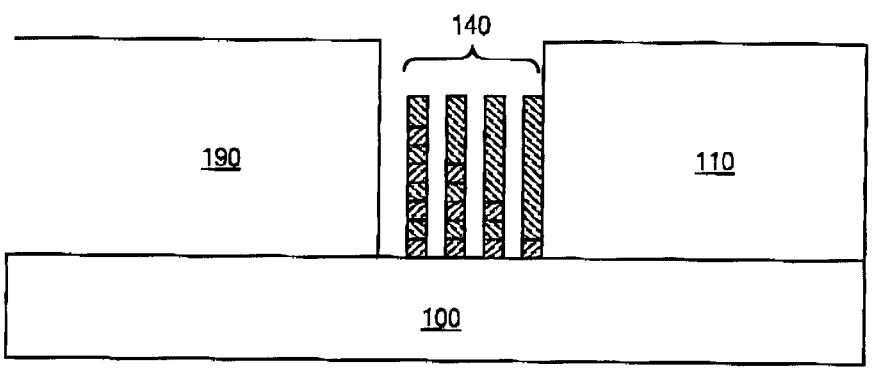
FIG. 12 shows an alternative process embodiment wherein, after a portion of the vertical component of the first material and the second material are etched to the substrate, a mask is patterned over a surface of the substrate exposing the area adjacent the remaining portion of the first and second material layers.

FIG. 11 shows a top view of a transistor formed on semiconductor substrate 100, such as for example, a field effect transistor (FET) formed on a silicon semiconductor substrate. FIG. 12 shows a cross-sectional side view taken through line A—A of FIG. 11. The transistor device shown in FIGS. 11 and 12 includes gate electrode 170 formed over substrate 100 and junction regions 180 and 185 representing, source and drain regions, respectively, formed in substrate 100. Gate electrode 170 and junction regions 180 and 185, respectively, are formed according to techniques known in the art. Also formed in substrate 100 are a plurality of trenches filled with dielectric material 150 extending about the width of gate electrode 170. The plurality of dielectric-filled trenches defined in substrate 100 define channel region 172. Channel region 172 (FIG. 12) is comprised of a plurality of channel wires 150 adjacent the trenches that, in this embodiment, overlap junction regions 180 and 185. The channel wires offer, in this embodiment, a much higher drain current drive than conventional devices having a similar total channel width.

It has been shown theoretically that it is possible to greatly enhance the mobility of a silicon MOS transistor by up to an order of magnitude if the width of the device is of the order of 100 angstroms (Å). This conclusion rises from the fact that the width of the transistor (i.e., the channel) is of a dimension such that it forms a potential box, that causes thin strips of the channel to become quantized in the width direction, similar to the quantization of the inversion layer in the MOS transistor in the "Z" direction (at the gate oxide interface). With strips of channel approximating 100Å width, the inversion layer becomes quantized in the width direction resulting in an inversion layer for these transistors that resembles a series of quantum wires, with the density of electrons limited to the middle of the channel. Consequently, these transistors do not suffer the two-dimensional scattering that MOSFET devices normally undergo. The consequences of this are that it is possible to obtain transistors whose mobilities are increased by at least an order of magnitude over conventional devices.

Figure 1:
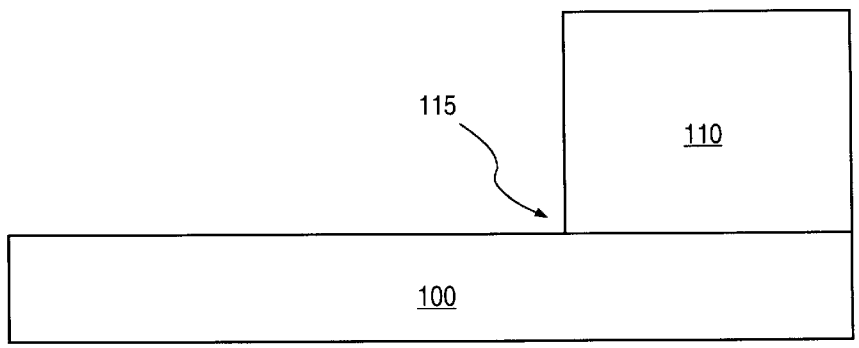
FIG. 1 is a schematic planar side view of a portion of a semiconductor substrate showing a spacer mask overlying the substrate in accordance with one embodiment of the invention.

Referring to FIGS. 1–10, a method of forming the structure shown in FIGS. 11 and 12 is described. FIG. 1 shows substrate 100 such as, for example, a silicon semiconductor substrate. Overlying substrate 100 is spacer mask 110. Spacer mask 110 is, for example, silicon dioxide ($SiO_2$), deposited as known in the art. Hard masks, such as $Sio_2$ and silicon nitride ($Si3N_4$), are generally suitable for use together with deposition techniques involving high temperatures. Other spacer masks, including soft masks such as photoresists, may also be suitable when commensurate with substrate processing parameters (e.g., temperature, pressure, etc.).

As shown in FIG. 1, spacer mask 110 has a lithographically-defined edge 115 such as a vertical edge. Forming the mask with a vertical edge angle, using anisotropic etch techniques including dry or chemical etching, is within the level of skill in the art. Defined edge 115, in this embodiment, serves as the pattern for a series of spacers that will be described below.

Figure 2:
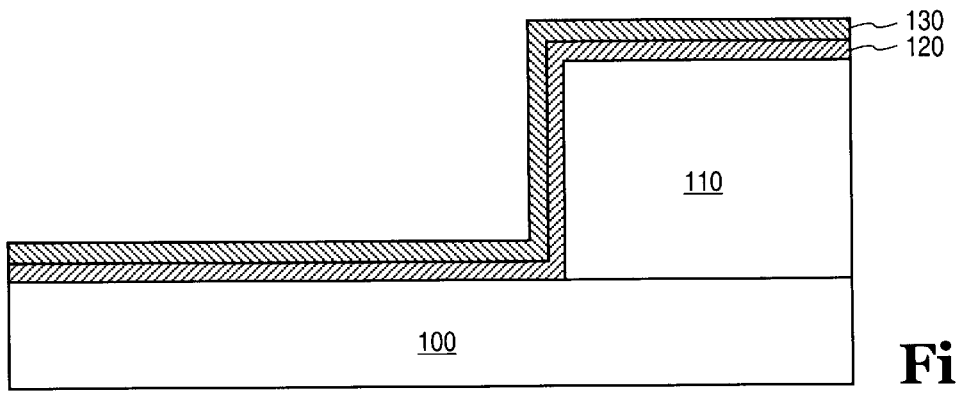
FIG. 2 shows the substrate of FIG. 1 after depositing a first layer and a second layer over the surface of the substrate including the spacer mask.

FIG. 2 shows substrate 100 after the further processing step of conformally depositing alternating thin films of two different materials, first material 120 and second material 130, respectively. It has been demonstrated in the semiconductor industry that various materials can be deposited with a controlled film thickness.

The thickness of deposited layers of first material 120 and second material 130 will determine the spacing of adjacent spacers formed of first material and second material. According to current technology, the thickness of first material 120 and second material 130 may be as little as 100 Angstroms (Å) or less.

As noted, first material 120 and second material 130 are, in one embodiment, different materials. The different materials, in one embodiment, have a different etch rate for a predetermined etchant. Suitable distinguishable etch rates include, but are not limited to, etch rates on the order of two to one and preferably more than two to one. In addition to etch rate, the materials may be chosen based on factors such as cost, ease of deposition, and compatibility with the deposition process and chamber. Suitable materials include, but are not limited to, $Si_3N_4$ and $SiO_2$, $Si_3N_4$ and polysilicon, and $SiO_2$ and polysilicon. The deposition of such materials may be accomplished through techniques known in the art.

Figure 3:
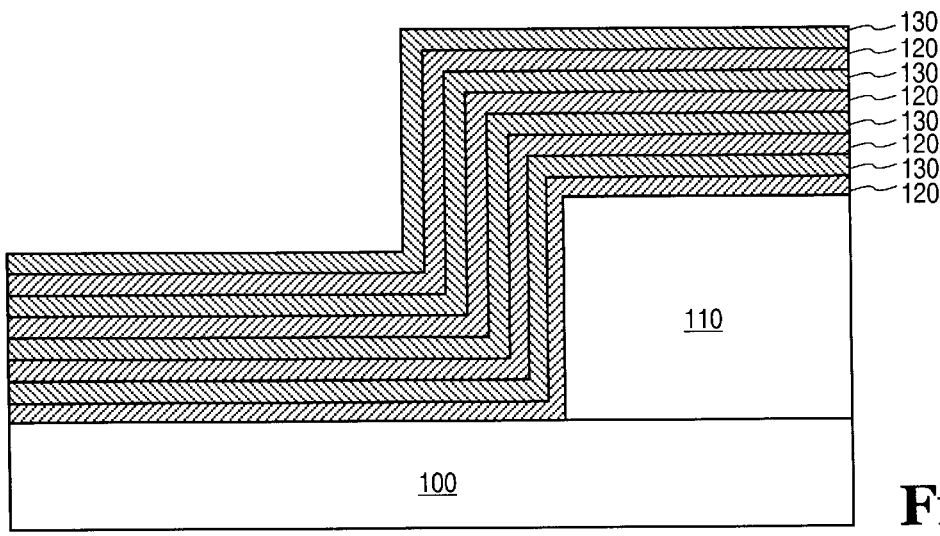
FIG. 3 shows the substrate of FIG. 2 after the further processing step of depositing a plurality of first material and second material layers over the substrate.

FIG. 3 shows substrate 100 after the further processing step of depositing multiple alternating layers of first material 120 and second material 130. In this embodiment, a number of layers of first material 120 and second material 130 are selected such that the width of the vertical component of the plurality of layers defines the channel width as well as the desired number of wires in substrate 100 for the resulting device.

Figure 4:
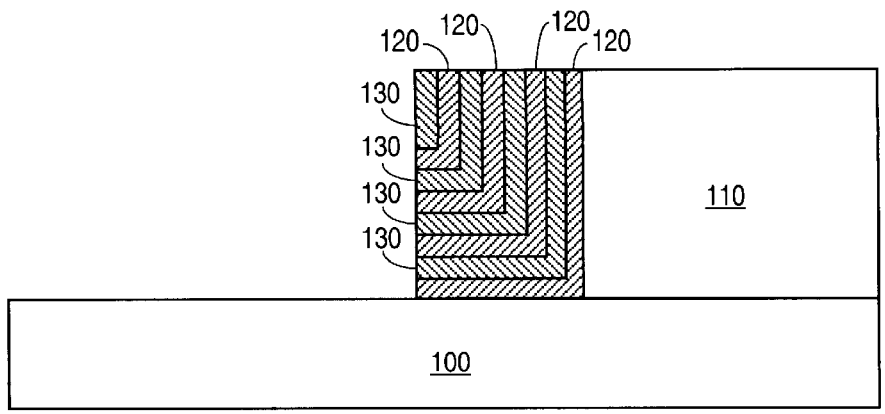
FIG. 4 shows the substrate of FIG. 3 after removing the horizontal portion of the first and second material layers.

FIG. 4 shows substrate 100 after anisotropically etching the layers of first material 120 and second material 130 to spacer mask 110 or substrate 100, using spacer mask 110 or substrate 100 as an etch stop. As shown in FIG. 4, after the etch of the multiple layers of first material 120 and second material 130, the majority of the horizontal components of each layer are removed leaving such layers constituted of substantially vertical components. A suitable anisotropic etch is one that has, in this case, little or no selectivity for either first material 120 or second material 130. A suitable etchant is, for example, an ion mill etchant.

Figure 5:
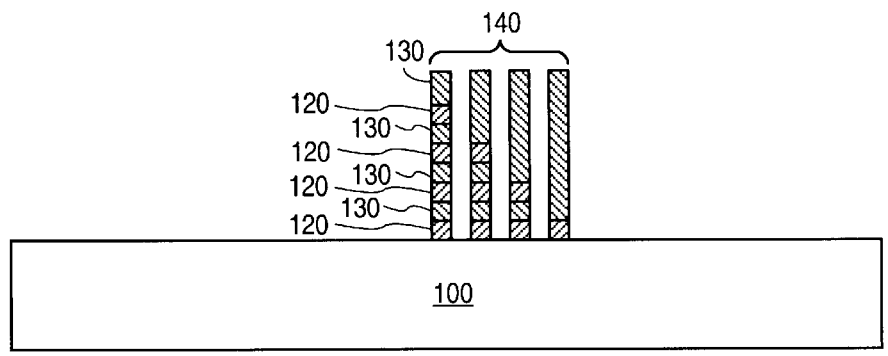
FIG. 5 shows the substrate of FIG. 4 after etching a portion of the vertical component of the first material and second material layers to the substrate to form an etch mask of a plurality of spacers.

As shown in FIG. 5, a subsequent etch is carried out in such a manner that first material 120 is removed more rapidly than second material 130. In one embodiment, the etchant is vertically constrained. The vertical constraint allows the etch to proceed anisotropically without undercutting the sides of the adjacent layer of first material 120 and/or second material 130. In the example where first material 120 is, for example, $SiO_2$ and second material 130 is $Si_3N_4$, a suitable etchant to etch $SiO_2$ at a faster rate than $Si_3N_4$ is a $C_4F_8$ etch chemistry. The following recipe, for example, yields a selectivity of $SiO_2$ to $Si_3N_4$ of 4.6 to 1:

| | |
|---|---|
| 10 SCCM | $C_4F_8$ |
| 50 SCCM | CO |
| 6 SCCM | $O_2$ |
| 200 SCCM | Ar. |

In one embodiment, the etchant removes both $SiO_2$ and $Si_3N_4$, but removes $SiO_2$ at a faster rate. Thus, the etch removes $SiO_2$ (first material 120) and also removes the $Si_3N_4$ (second material 130), albeit at a slower rate, that is vertically aligned with first material 120.

FIG. 5 shows substrate 100 after the processing step of anisotropically etching the remaining portions of first material 120 and second material 130 to substrate 100. As shown in FIG. 5, the plurality of layers of first material 120 and second material 130 form periodic or etch mask 140 having spacer components spaced from one another by a thickness attributable to, in large part, the film thickness of alternating layers of first material 120 and second material 130. In the example where spacer mask 110 is $Sio_2$, spacer mask 110 is also removed as shown in FIG. 5.

Figure 6:
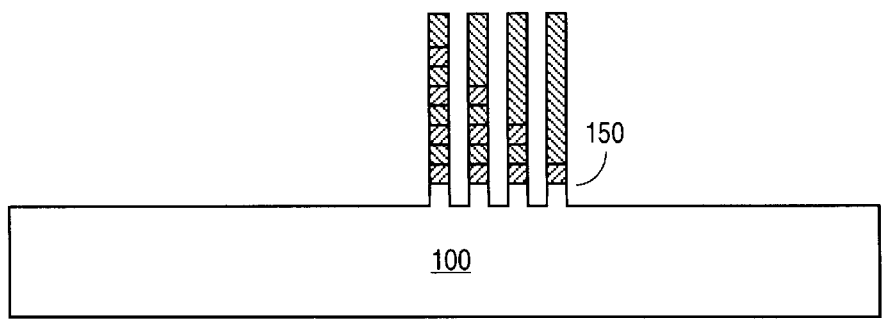
FIG. 6 shows the substrate of FIG. 5 after etching the substrate.

FIG. 6 shows the subsequent processing step of etching substrate 100 to form raised wires 150 corresponding to those areas of the substrate protected by periodic mask 140. The etching of substrate 100 may be carried out by a conventional etch chemistry, such as for example, $BCl_3/Cl_2$, $H_2/Cl_2/SiCl_4$, and $HCl_3/H_2/N_2$, or other suitable etch chemistry as known in the art for etching a silicon semiconductor, for example. In one example, the etching proceeds to a depth of approximately 100–200 Å.

Figure 7:
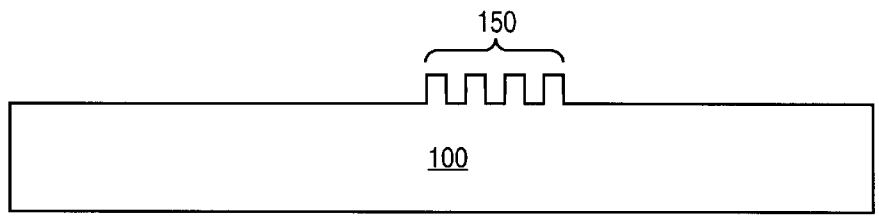
FIG. 7 shows the substrate of FIG. 6 after removing the etch mask.

FIG. 7 shows the structure after the removal of periodic mask 140. Periodic mask 140 may be removed by conventional techniques, e.g., etching. In the example where periodic mask 140 constitutes a combination of first material 120 and second material 130, a non-selective etchant or an etchant that, in this case, etches second material 130 faster than first material 120 is suitable. FIG. 7 shows a plurality of wires 150 (in this case four) formed in substrate 100.

Figure 8:
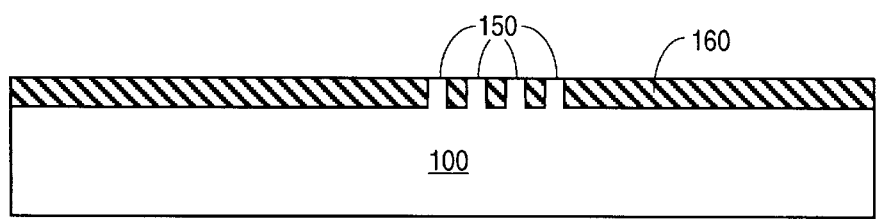
FIG. 8 shows the substrate of FIG. 7 after passivating a portion of the surface of the substrate.
Figure 9:
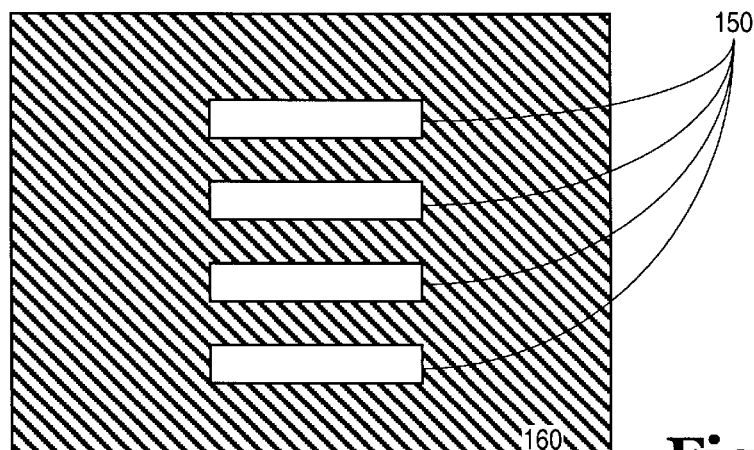
FIG. 9 shows a top view of the substrate depicted in FIG. 8.

FIG. 8 shows the structure after forming dielectric material 160 over the top surface of substrate 100 including the areas between raised wires 150. A suitable dielectric is, for example, thermally grown $SiO_2$. The dielectric may also be deposited such as a tetraethyl orthosilicate (TEOS) material. In one embodiment, dielectric material 160 and the surface of substrate 100 (raised by wires 150) is substantially planar as shown in FIG. 8. FIG. 9 shows a top view of the structure and illustrates wires 150 formed in substrate 100.

Figure 10:
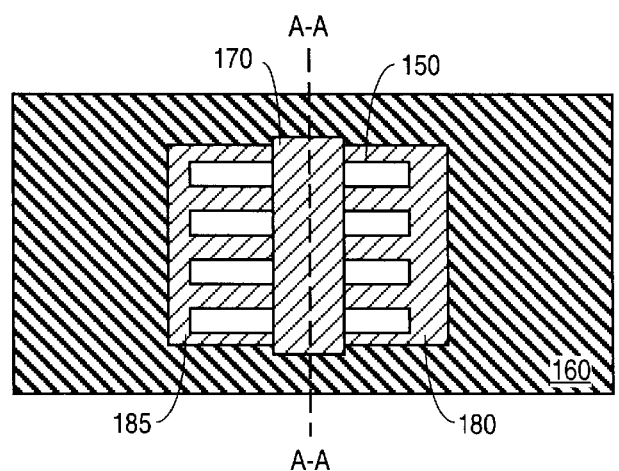
FIG. 10 shows a top view of the substrate of FIG. 8 after forming a transistor structure of a gate electrode and junction regions.

FIG. 10 shows the structure of FIG. 9 after forming a transistor device in conjunction with wires 150, the wires acting as the channel between junction 180 and junction 185. Gate electrode 170 overlies wires 150, and channels overlap junction 180 and junction 185.

FIG. 11 shows a cross-sectional view through line A—A of FIG. 10. FIG. 11 shows gate electrode 170 overlying gate dielectric 175 and extending over wires 150 to form channel region 172. Junction regions 180 and 185 extend in and out of the page, respectively. Wires 150 extend into or overlap junction regions 180 and 185.

Figure 13:
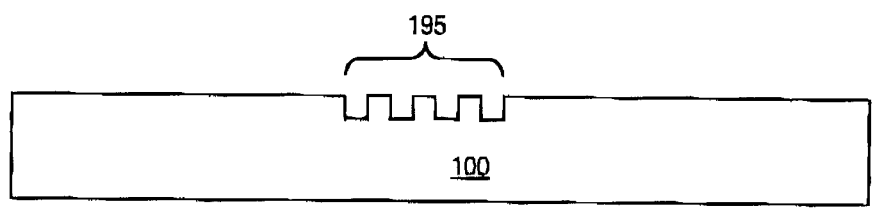
FIG. 13 shows the structure of FIG. 12 after etching trenches into substrate and removing the masking material, including the remaining first material and second material layers over the substrate.
Figure 14:
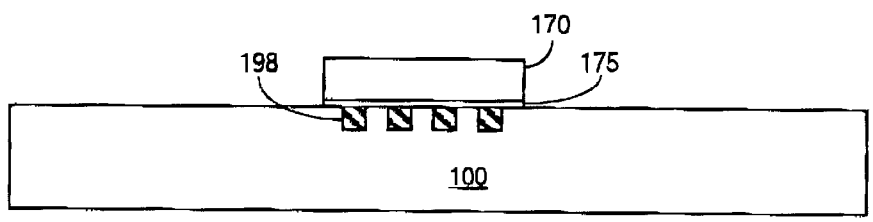
FIG. 14 shows the substrate of FIG. 13 after forming a gate electrode over the substrate.

FIGS. 12–14 show a second embodiment of a method of forming a transistor on a semiconductor substrate according to the invention. In this embodiment, the method steps include the steps illustrated in FIGS. 1–5 and the accompanying text of forming periodic mask 140 on a substrate 100 adjacent spacer mask 110. FIG. 12 shows the structure after the processing step of forming additional spacer mask 190 over substrate 100. Spacer masks 110 and 190 and vertical periodic spacers 140 serve as a mask pattern to form four trenches in substrate 100 while protecting adjacent areas of the substrate field. In one embodiment, spacer mask 190 is similar to spacer mask 110 (e.g., $SiO_2$ or $Si_3N_4$)

FIG. 13 shows the structure after the processing step of forming four trenches in substrate 100 corresponding to the exposed areas of the substrate adjacent periodic mask 140, as well as the step(s) of removal of spacer mask 110 and 190 and periodic mask 140. FIG. 13 reveals four wires 195 formed in or below the surface of substrate 100 adjacent the trenches. An exemplary depth of the trenches and corresponding height of wires 195 is 100–200 Å.

FIG. 14 shows the structure after the further processing step of forming dielectric material 198 in the trenches adjacent wires 195 as described above, for example, with reference to FIG. 7 and the accompanying text. FIG. 14 also shows the structure including gate electrode 170 overlying gate dielectric 175 and the wires as channel media.

The above method addresses the limitations on scaling by adapting film deposition techniques to spacer formation. The method allows continued process integration by addressing transistor mobility. The method also provides a technique for producing quantum wire transistors, wherein a series of channel wires, each of whose dimensions may be on the order of 100 Å or less are used to quantize the current into quantum wires, which greatly reduces the scattering of the inversion layer charge and thus greatly increases the transistor's mobility. The increase in drain saturation current increases chip performance which increases chip speed.

The method described above has been described in reference to forming transistors capable of improved performance even at reduced feature sizes. It is to be appreciated, that the techniques described should not be limited to forming transistors. Instead, the patterning technique may be implemented in many other processes, particularly where reduced width trenches, wires, posts, or similar structures are desired. It is also to be appreciated that various modifications may be made to the above method where desirous without departing from the spirit and scope of the invention. For instance, a plurality of films having different thicknesses may be deposited to form a vertical periodic step with different etch characteristics. In this manner, trenches of different sizes (e.g., depth, width) may be formed.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:
    forming a spacer mask having a defined edge over a first portion of a substrate;
    alternatively conformally depositing over a second portion of the substrate including the spacer mask a predetermined number of layers of at least a first material and a second material, the first material having a different etch rate for a predetermined etchant than the second material; and forming a free-standing spacer comprising the first material and the second material, having a width equivalent to the thickness of one of a layer of the first material and a layer of the second material.

2. The method of claim 1, wherein forming the spacer comprises anisotropically etching to the substrate the at least one layer of the first material and the second material with the predetermined etchant.

3. The method of claim 1, wherein the defined edge of the spacer mask is vertical and the conformal deposition of the alternatively deposited at least one layer of first material and second material define a width corresponding to a width of a portion of a transistor channel.

4. The method of claim 3, further comprising:
forming at least one trench in the substrate defined by the spacer.

5. The method of claim 4, wherein the alternatively depositing of the at least one first material and at least one second material comprises alternatively depositing a plurality of layers of the first material and the second material.

6. The method of claim 5, wherein each of the alternatively deposited layers of first material and second material has a predetermined thickness, the thickness of one of the first material and the second material determining the thickness of the at least one trench in the substrate and the height of the spacer mask is selected according to the number of layers of the first material and the second material.

7. The method of claim 2, wherein prior to anisotropically etching to the substrate, the method comprises anisotropically etching the at least one layer of first material and second material to a top surface of the spacer mask.

8. The method of claim 2, wherein the anisotropical etching to the substrate comprises etching the at least one layer of the first material at a faster rate than the second material.

9. The method of claim 1, further comprising forming dielectric material in the at least one trench.

10. A method comprising:
alternatively depositing a plurality of layers of first material and a plurality of layers of second material on a substrate such that each of the plurality of layers of first material and the plurality of layers of second material has a vertical component;
anisotropically etching to the substrate the plurality of layers of first material and the plurality of layers of second material with an etchant having a different etch rate for each of the first material and the second material, the etch retaining a plurality of free-standing portions comprising first material and second material;
forming openings in the substrate adjacent the retained portions, the openings defining wires in the substrate; and
removing the retained portions.

11. The method of claim 10, wherein alternatively depositing further comprises:
conformally alternatively depositing each of the plurality of layers of first material and the plurality of layers of second material adjacent a spacer mask on the substrate having a defined edge.

12. The method of claim 11, wherein the defined edge of the spacer mask is vertical and the conformal deposition of the alternatively deposited plurality of layers of first material and a plurality of layers of second material define a width corresponding to a width of a portion of a transistor channel.

13. The method of claim 12, wherein each of the alternatively deposited plurality of layers of the first material and plurality of layers of the second material has a predetermined thickness, the thickness of one of the first material and the second material determining the thickness of the wires in the substrate and the height of the spacer mask is selected according to the number of first material layers and second material layers.

14. The method of claim 11, wherein prior to anisotropically etching to the substrate, the method comprises anisotropically etching the plurality of layers of first material and the plurality of layers of second material to a top surface of the spacer mask.

15. A method of forming a transistor comprising:
forming a spacer mask over a portion of a substrate, the spacer mask having a vertical edge;
alternatively conformally depositing over a portion of the substrate including the spacer mask a predetermined number of layers of at least a first material and a second material, the first material having a different etch rate for a predetermined etchant than the second material, the predetermined number of layers corresponding to a desired channel width;
anisotropically etching to the substrate a vertical component of the predetermined layers of the first material and the second material with the predetermined etchant;
forming openings in the substrate in an area corresponding to a remaining portion of the vertical component of the predetermined layers of the first material and the second material;
removing the remaining portions of the predetermined layers of the first material and the second material; and
forming a gate electrode over the area corresponding with the openings in the substrate.

16. The method of claim 15, wherein each of the alternatively deposited first material layer and second material layer has a predetermined thickness, the thickness of one of the first material layer and the second material layer determining the thickness of the wines in the substrate and the height of the spacer mask is selected according to the number of first material layers and second material layers.

17. The method of claim 15, wherein prior to anisotropically etching to the substrate, the method comprises anisotropically etching the first material layer and the second material layer to a top surface of the spacer mask.

18. The method of claim 15, wherein the anisotropical etching to the substrate comprises etching the first material layer at a faster rate than the second material layer.

19. A method comprising:
forming a spacer mask having a defined edge over a first portion of a substrate;
conformally depositing a plurality of layers of a first material and a plurality of layers of a second material over a second portion of the substrate including the spacer mask, the depositing comprising an alternating sequence between first material and second material; and
forming at least one free-standing spacer comprising at least one of the first material and the second material and having a width equivalent to the thickness of one of a layer of the first material and a layer of the second material.

20. The method of claim 19, wherein forming the spacer comprises anisotropically etching to the substrate at least one layer of the first material and the second material.

21. The method of claim 19, wherein the defined edge of the spacer mask is vertical and the conformal deposition of the plurality of layers of first material and second material define a width corresponding to a width of a portion of a transistor channel.

22. The method of claim 21, further comprising:
forming at least one trench in the substrate defined by the spacer.

23. The method of claim 22, wherein each of the plurality of layers of first material and second material has a selected thickness, the thickness of one of the first material and the second material determining the thickness of the at least one trench in the substrate and the height of the spacer mask is selected according to the number of layers of the first material and the second material.

24. The method of claim 20, wherein prior to anisotropically etching to the substrate, the method comprises anisotropically etching the plurality of layers of first material and second material to a top surface of the spacer mask.

* * * * *